(12) United States Patent
Kroeker et al.

(10) Patent No.: US 6,222,337 B1
(45) Date of Patent: Apr. 24, 2001

(54) MECHANICALLY CLAMPING ROBOT WRIST

(75) Inventors: Tony Kroeker, Georgetown, TX (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/324,617

(22) Filed: Jun. 2, 1999

Related U.S. Application Data

(62) Division of application No. 08/801,076, filed on Feb. 14, 1997, now Pat. No. 5,955,858.

(51) Int. Cl.⁷ .................................................... B25J 15/00
(52) U.S. Cl. ...................................................... 318/568.11
(58) Field of Search ..................... 318/568.11; 901/31; 294/94; 414/729

(56) References Cited

U.S. PATENT DOCUMENTS

| | | | |
|---|---|---|---|
| 4,184,188 | * 1/1980 | Briglia | 361/234 |
| 4,586,743 | 5/1986 | Edwards et al. | 294/86.4 |
| 4,705,951 | 11/1987 | Layman et al. | 250/442.1 |
| 4,733,632 | * 3/1988 | Ohmi et al. | 118/729 |
| 4,813,732 | 3/1989 | Klem | 294/103.1 |
| 4,962,441 | * 10/1990 | Collins | 361/234 |
| 5,022,695 | 6/1991 | Ayers | 294/88 |
| 5,133,635 | 7/1992 | Malin et al. | 414/744.8 |
| 5,180,276 | 1/1993 | Hendrickson | 414/752 |
| 5,280,983 | 1/1994 | Maydan et al. | 294/119.1 |
| 5,324,155 | 6/1994 | Goodwin et al. | 414/225 |
| 5,374,147 | 12/1994 | Hiroki et al. | 414/217 |
| 5,447,409 | 9/1995 | Grunes et al. | 414/744.6 |
| 5,469,035 | 11/1995 | Lowrance | 318/568.1 |
| 5,645,646 | 7/1997 | Beinglass et al. | 118/730 |
| 5,647,626 | * 7/1997 | Chen et al. | 294/87.1 |
| 5,702,228 | 12/1997 | Tamai et al. | 414/744.5 |
| 5,720,590 | 2/1998 | Hofmeister | 414/744.2 |
| 5,733,096 | 3/1998 | Van Doren et al. | 414/744.3 |
| 5,885,353 | 3/1999 | Strodtbeck et al. | 118/712 |
| 5,935,338 | 8/1999 | Lei et al. | 118/725 |

FOREIGN PATENT DOCUMENTS

| | | | |
|---|---|---|---|
| 0 423 608 A1 | 4/1991 | (EP) | B25J/9/12 |
| 0445651A2 | 9/1991 | (EP) | H01L/21/00 |
| 0777264A1 | 6/1997 | (EP) | H01L/21/00 |
| 0 793 262 A2 | 9/1997 | (EP) | H01L/21/00 |
| 5-13550 | * 1/1993 | (JP) . | |

* cited by examiner

Primary Examiner—Bentsu Ro
(74) Attorney, Agent, or Firm—Thomason, Moser & Patterson

(57) ABSTRACT

The present invention generally provides a robot that can transfer a workpiece, such as a silicon wafer, at increased speeds and accelerations/decelerations. More particularly, the present invention provides a robot wrist for mechanically clamping a workpiece to a workpiece handling member of an extendable robot arm. The wafer clamp selectively applies sufficient force to center the workpiece and prevent slippage and damage to the workpiece during rapid rotation and radial movement of the handling member. In one embodiment, a clamp for securing silicon wafers uses two independent clamp fingers to position and hold the wafer with minimal particle generation and wafer damage. The clamp is designed so that wafers are normally clamped except during full extension of the wafer handling member to deliver or pickup a wafer.

13 Claims, 9 Drawing Sheets

FIG. 10A

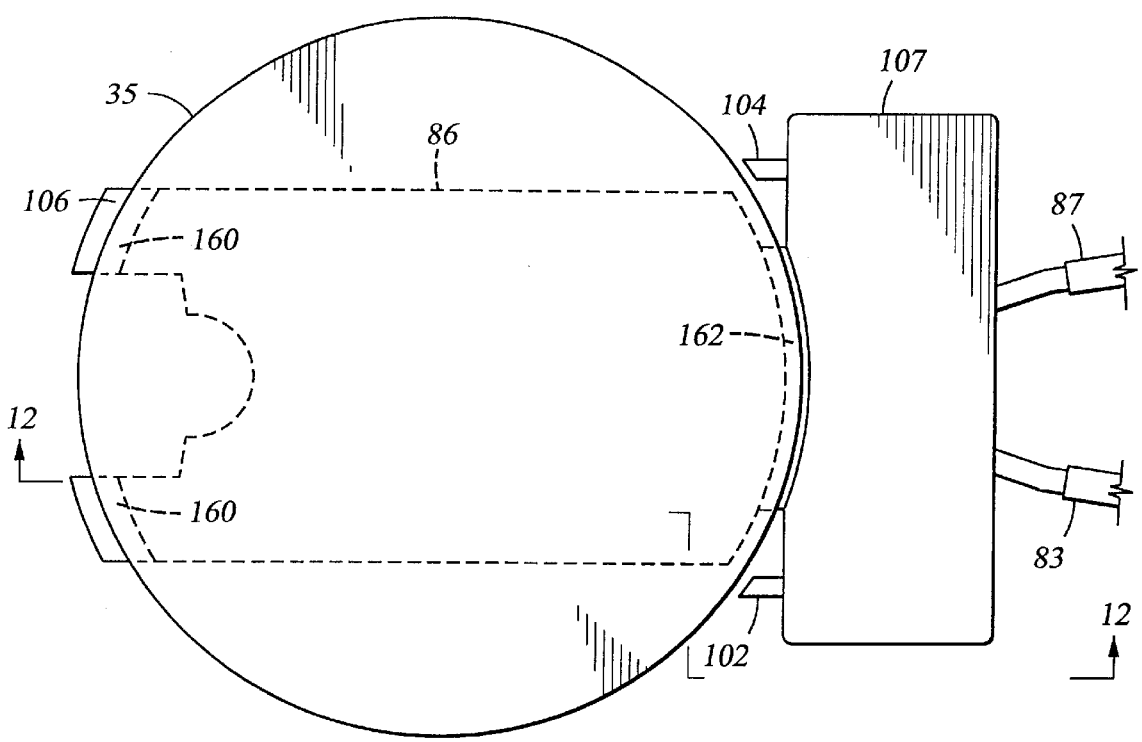
*Fig. 11*
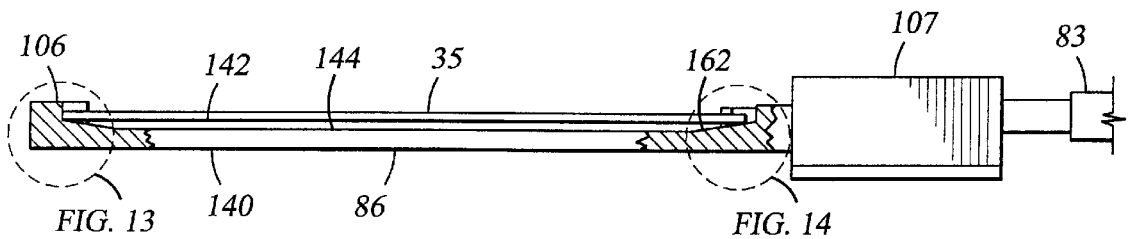
*Fig. 12*
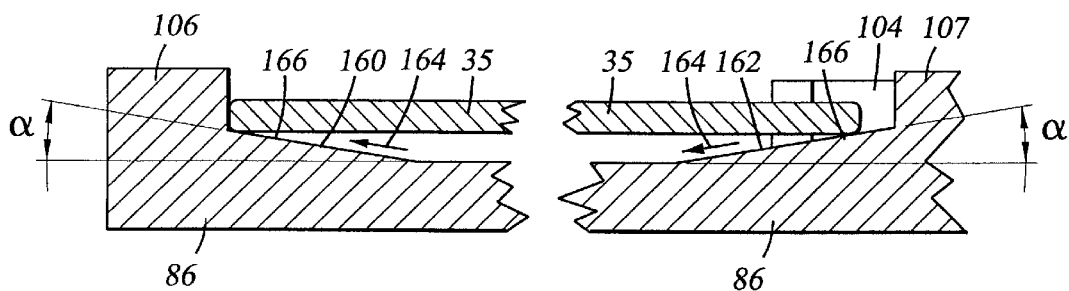
*Fig. 13*     *Fig. 14*

MECHANICALLY CLAMPING ROBOT WRIST

This is a divisional of copending application Ser. No. 08/801,076 filed on Feb. 14, 1997, now U.S. Pat. No. 5,955,858.

BACKGROUND OF THE INVENTION

1. Field of the Invention

The present invention relates to a clamping mechanism that secures a workpiece to a mechanical arm. More particularly, the present invention relates to a clamp that gently secures and centers a semiconductor wafer to a robot blade when the robot arms are at least partially retracted for rotation within a transfer chamber.

2. Background of the Related Art

Modern semiconductor processing systems include cluster tools that integrate a number of process chambers together in order to perform several sequential processing steps without removing the substrate from the highly controlled processing environment. These chambers may include, for example, degas chambers, substrate pre-conditioning chambers, cooldown chambers, transfer chambers, chemical vapor deposition chambers, physical vapor deposition chambers, and etch chambers. The combination of chambers in a cluster tool, as well as the operating conditions and parameters under which those chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing them, one by one, through a series of chambers or process steps. The process recipes and sequences will typically be programmed into a microprocessor controller that will direct, control and monitor the processing of each substrate through the cluster tool. Once an entire cassette of wafers has been successfully processed through the cluster tool, the cassette may be passed to yet another cluster tool or stand alone tool, such as a chemical mechanical polisher, for further processing.

The amount of time required by each process and handling step has a direct impact on the throughput of substrates per unit of time. Processes that require greater amounts of time to achieve the desired result may necessitate that multiple chambers or tools be operated in parallel. On the other hand, processes that are completed in a short amount of time may be allowed to sit idle for brief periods, depending upon the economic considerations of cost of ownership and cost of operation. However, while the exact design of an integrated circuit fabrication system may be complex, it is almost always beneficial to perform each step as quickly as possible to maximize overall throughput without detrimentally effecting product quality, operating costs or the life of the equipment. One exemplary fabrication system is the cluster tool, shown in FIG. 1, disclosed in U.S. Pat. No. 5,186,718, entitled "Staged-Vacuum Wafer Processing System and Method," Tepman et al., issued on Feb. 16, 1993, which is hereby incorporated by reference.

The substrate throughput in a cluster tool can be improved by increasing the speed of the wafer handling robot positioned in each transfer chamber. The robot of FIG. 1 is shown in greater detail in FIG. 2 and is the subject of U.S. Pat. No. 5,469,035 entitled "Two-axis Magnetically Coupled Robot," issued on Nov. 21, 1995, which is hereby incorporated by reference. Referring to FIG. 2, the magnetically coupled robot comprises a frog-leg type connection or arms between the magnetic clamps and the wafer blade to provide both radial and rotational movement of the robot blade within a fixed plane. Radial and rotational movements can be coordinated or combined in order to pickup, transfer and deliver substrates from one location within the cluster tool to another, such as from one chamber to an adjacent chamber.

As the robot speed and acceleration increase, the amount of time spent handling each substrate and delivering each substrate to its next destination is decreased. However, the desire for speed must be balanced against the possibility of damaging the substrate or the films formed thereon. If a robot moves the wafer blade too abruptly, or rotates the wafer blade too fast, then the wafer may slide off the blade, potentially damaging both the wafer and the chamber or robot.

The robot blade is typically made with a wafer bridge on the distal end of the wafer blade that extends upward to restrain the wafer from slipping over the end. However, the wafer bridge does not extend around the sides of the blade and does very little to prevent the wafer from slipping laterally (i.e., side to side) on the blade. Furthermore, the wafers are not always perfectly positioned against the bridge. Sudden movement or high rotational speeds may throw the wafer against the bridge and cause damage to the wafer or cause the wafer to slip over the bridge and/or off of the blade.

There is a certain amount of friction that exists between the bottom surface of a wafer and the top surface of the wafer blade to resist slippage of the wafer. However, the bottom surface of a silicon wafer is very smooth and has a low coefficient of friction with the wafer blade, which is typically made of stainless steel or ceramic. Furthermore, a typical wafer is so lightweight that the total resistance due to friction is easily exceeded by the centrifugal forces applied during rapid rotation of the robot, even when the blade is in the fully retracted position. However, this low coefficient of friction is typically relied upon when determining the speed at which the robot rotates.

Therefore, there is still a need for a robot that can transfer wafers at increased speeds and accelerations/decelerations. More particularly, there is a need for a wafer clamping mechanism for a robot that can secure a wafer with sufficient force to prevent slippage and wafer damage during rapid rotation and radial movement. It would be desirable if the clamping mechanism would cause minimal or no particle generation and wafer damage. It would be further desirable if the clamp would automatically engage the wafer except during full extension of the wafer blade when the blade is delivering or picking up a wafer.

SUMMARY OF THE INVENTION

The present invention provides a clamp wrist for a pair of frog-leg type robot arms. The clamp wrist comprises a cam formed on the distal end of each robot arm, wherein each cam has a gear that intermeshes with the other gear and a cog. A base plate is pivotally coupled to each cam. A clamp finger, having a contact pad and a retraction lip, is urged against a workpiece by a biasing member, such as a spring, coupled to the base plate. The cog on each cam is radially positioned to engage the retraction lip and pull the clamp finger away from the workpiece when the robot arms reach a given degree of extension. The retraction lip may be adjustably coupled to the clamp finger so that the lip can be moved relative to the cog for changing the degree of robot arm extension at which the clamp finger is retracted from the workpiece. A roller may be Another aspect of the invention provides a clamping mechanism for securing a wafer to a robot workpiece handling member at the distal end of a robot arm. The clamping mechanism includes a clamp finger for contacting the workpiece. The clamp finger is urged against the workpiece by a biasing member coupled between a proximal end of the handling member and the clamp finger. The workpiece is retained between the clamp finger and a retaining bridge on the distal end of the handling member. A retractor pulls the clamp finger away from the workpiece when the handling member is extended.

In yet another aspect of the invention, a robot is provided including first and second members coaxially rotatable about a first axis. The robot also includes first and second magnetic drives for driving the first and second members disposed on a first side of a wall so as to be rotatable without contact to the wall, wherein the first and second magnetic drives comprise first and second drive portions disposed on a second side of the wall to rotate the first and second members. First and second arms are coupled to the first and second members respectively so that rotations of the first and second members rotate the first and second arms respectively causing two independent motions of the robot that include rotation of the robot about the axis of rotational symmetry and linear, radial extension of a robot arm from the axis of rotational symmetry. First and second struts are then coupled to the first and second arms respectively to form first and second arm assemblies. A base plate is then coupled to the first and second arm assemblies, the base plate having a workpiece handling member and a biasing member coupled to the base plate for urging a clamp finger having a contact pad and a retraction lip against a workpiece. A cog radially extends from each cam to engage the retraction lip and pull the clamp finger away from the workpiece when the robot arms reach a given degree of extension. It is preferred that the cams incorporate a pair of intermeshed gears coupling the first and second arm assemblies to the wafer blade.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

FIGS. 11 and 12 are top and cross-sectional views of a wafer blade having a sloped pocket that supports the wafer.

FIGS. 13 and 14 are partial cross-sectional views of the distal and proximate ends of a wafer blade and sloped pocket as indicated in FIG. 12.

DETAILED DESCRIPTION OF A PREFERRED EMBODIMENT

The present invention generally provides a robot that can transfer wafers at increased speeds and accelerations/decelerations. More particularly, the present invention provides a robot wrist for mechanically clamping a workpiece to a workpiece handling member of an extendable robot arm. The wafer clamp selectively applies sufficient force to prevent wafer slippage and wafer damage during rapid rotation and radial movement of the blade while allowing transfer of the wafer to be accomplished. The wafer clamp also serves to center the wafer on the blade. In one embodiment, the clamp uses two independent clamp fingers to position and hold the wafer with minimal particle generation and wafer damage. The clamp is designed so that wafers are normally clamped except during full extension of the wafer blade when the blade is delivering or picking up a wafer.

Figure 2:
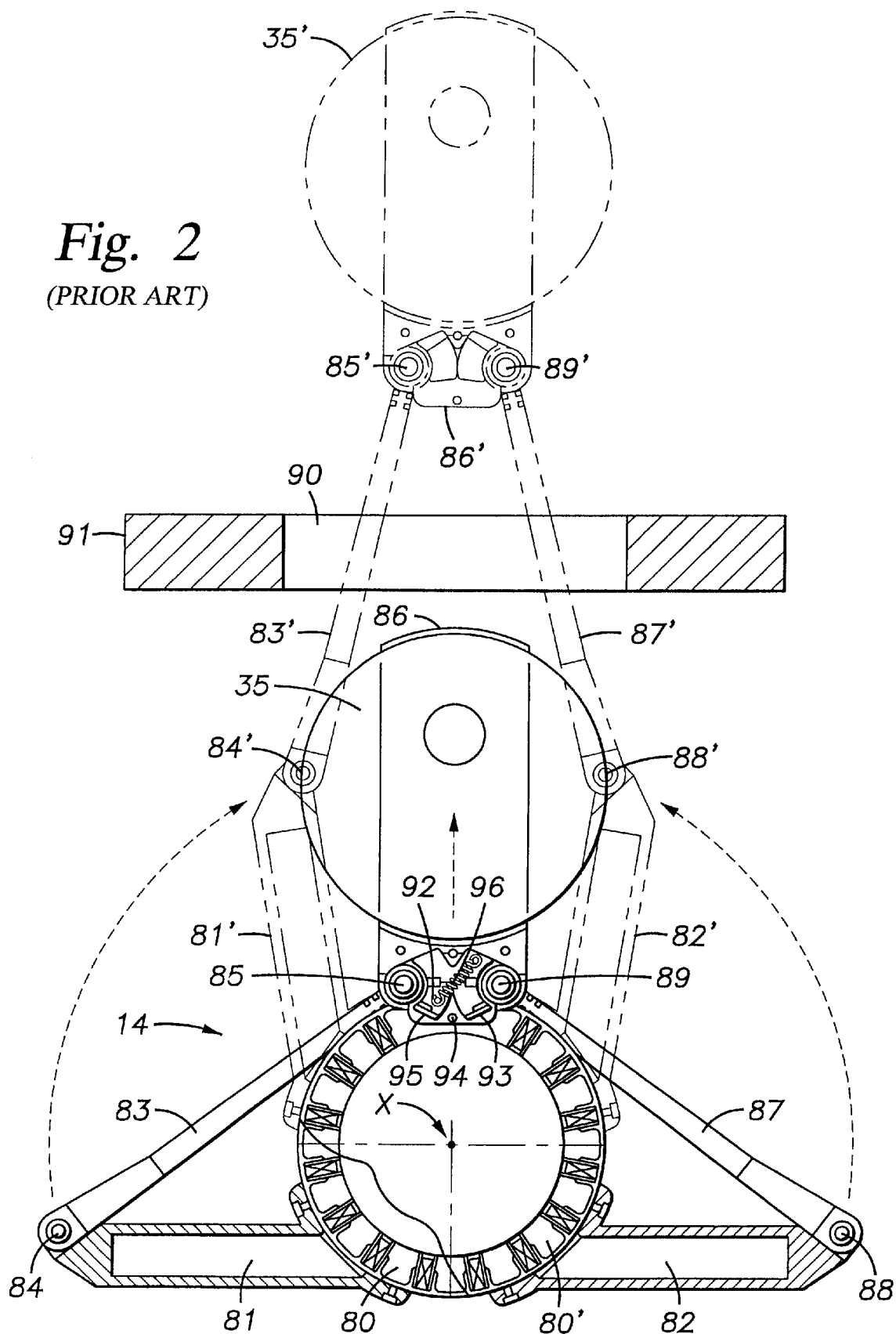
FIG. 2 is a schematic view of the robot arm assembly of FIG. 1 illustrating the retracted and extended positions.

The clamp of the present invention is useful in cooperation with robots in integrated circuit fabrication processes. In particular, the clamp can be incorporated into a wafer handling robot of a cluster tool to allow more rapid transfer of wafers from one location to another. An exemplary "frog-leg" type robot (as shown in FIG. 2) comprises two concentric rings magnetically coupled to computer-controlled drive motors for rotating the rings about a common axis. Each ring has a first strut rigidly extending therefrom. The ends farthest from the rings are provided with pivoting joints for coupling with second struts. The ends of the second struts, farthest from the first struts, i.e. the distal ends, are pivotally coupled to a common rigid member, such as a robot blade.

The wrist clamp of the present invention is positioned at the distal end of the robot arm(s), as defined above, and includes a pair of independent clamp fingers that are biased to engage, center and secure a wafer by contacting only the perimeter edge of the wafer. A wafer is released from the clamp fingers only when the robot arm has been extended to a predetermined radial distance as required to allow the wafer to be removed from the blade. The clamp fingers are preferably biased toward the wafer by a spring, such as a parallelogram spring. As the robot arm is extended, pivots or cams at the distal ends of the frog leg-like arm struts rotate in opposite directions. This rotation of each cam allows a cog extending therefrom to engage a lip on the clamp finger and forcibly retract the finger from its normally extended position. It is preferred that the lip include a roller for facing engagement with the cog to prevent friction between the lip and cog that could generate particles. When the robot arm is retracted, the cogs disengage the clamp finger allowing the finger to return to the extended position. In this manner, the clamp provides an automatic mechanical clamping of the wafer with a force determinable by the selection of the spring. The radial distance at which the wafer is released is adjustable by repositioning the lip of the clamp finger so that it is engaged by the cog at the desired degree of robot arm extension.

Figure 1:
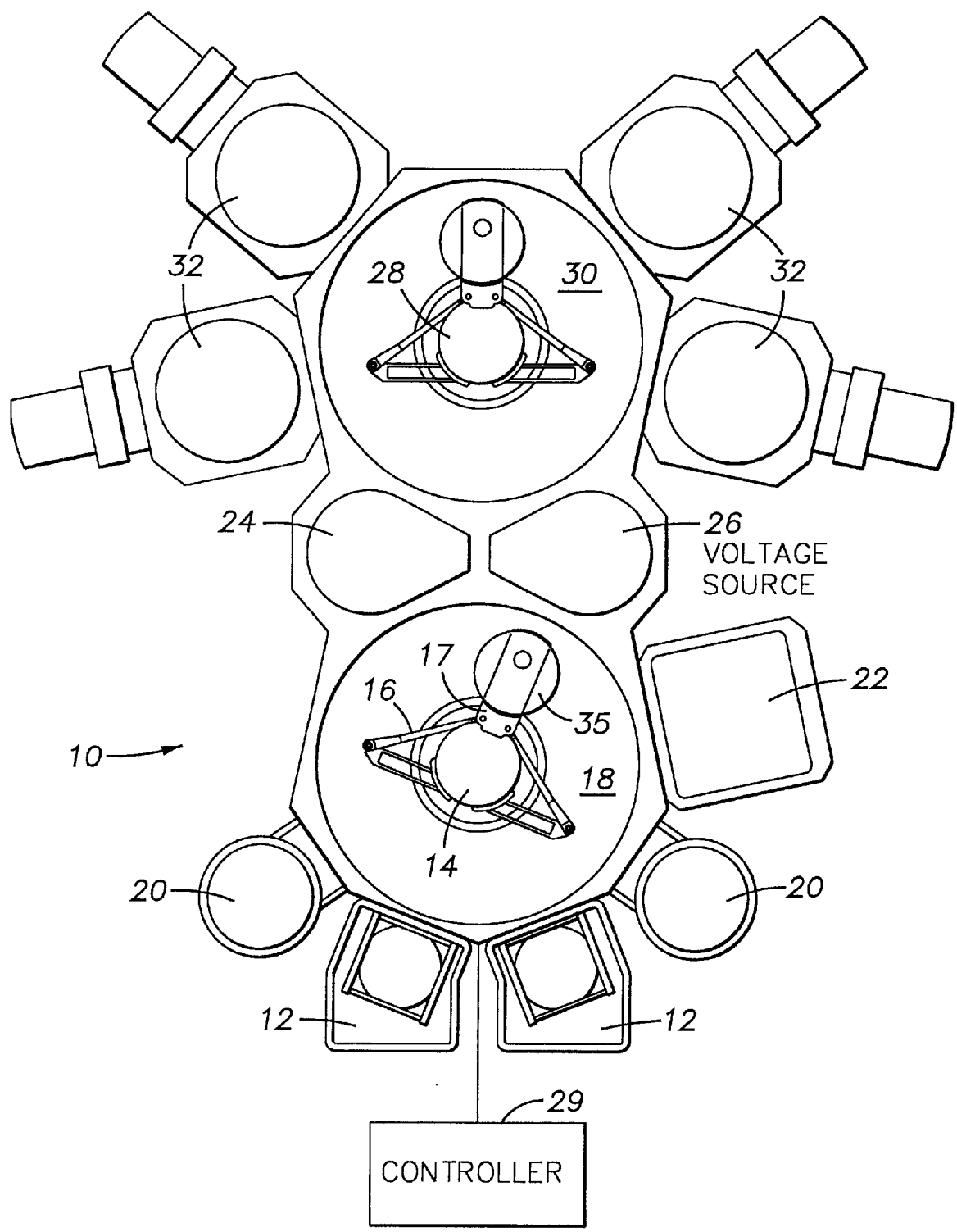
FIG. 1 is a schematic view of a cluster tool having a robot for wafer handling.

Referring now to FIG. 1, a schematic diagram of an exemplary integrated cluster tool 10 is shown. Substrates are introduced into and withdrawn from the cluster tool 10 through a cassette loadlock 12. A robot 14 having a blade 17 is located within the cluster tool 10 to transfer the substrates from one process chamber to another, for example cassette loadlock 12, degas wafer orientation chamber 20, preclean chamber 24, PVD TiN chamber 22 and cooldown chamber 26. The robot blade 17 is illustrated in the retracted position for rotating freely within the chamber 18.

A second robot 28 is located in transfer chamber 30 to transfer substrates between various chambers, such as the cooldown chamber 26, preclean chamber 24, CVD Al chamber 84 and a PVD AlCu processing chamber 88. The specific configuration of the chambers in FIG. 1 is merely illustrative and comprises an integrated processing system capable of both CVD and PVD processes in a single cluster tool. In a preferred aspect of the invention, a microprocessor controller 29 is provided to control the fabricating process sequence, conditions within the cluster tool and operation of the robots 14,28.

Now referring to FIG. 2, a schematic view of the magnetically coupled robot 14 of FIG. 1 is shown in both the retracted and extended positions. The robot includes a first strut 81 rigidly attached to a first magnet clamp 80 and a second strut 82 rigidly attached to a second magnet clamp 80'. A third strut 83 is attached by a pivot 84 to strut 81 and by a pivot 85 to a wafer blade 86. A fourth strut 87 is attached by a pivot 88 to strut 82 and by a pivot 89 to wafer blade 86. The structure of struts 81–83, 87 and pivots 84, 85, 88, 89 form a "frog leg" type connection of wafer blade 86 to magnet clamps 80,80'.

When magnet clamps 80,80' rotate in the same direction with the same angular velocity, then robot 14 also rotates about axis x in this same direction with the same velocity. When magnet clamps 80,80' rotate in opposite directions with the same absolute angular velocity, then there is no rotation of assembly 14, but instead there is linear radial movement of wafer blade 86 to a position illustrated by dashed elements 81'–89'.

A wafer 35 is shown being loaded on wafer blade 86 to illustrate that the wafer blade can be extended through a wafer transfer slot 90 in a wall 91 of a chamber 32 to transfer such a wafer into or out of the chamber 32. This robot provides the advantage of being free of particulate generation via a rotary vacuum seal. The mode in which both motors rotate in the same direction at the same speed can be used to rotate the robot from a position suitable for wafer exchange with one of the adjacent chambers 12,20,22,24,26 (see FIG. 1) to a position suitable for wafer exchange with another of these chambers. The mode in which both motors rotate with the same speed in opposite directions is then used to extend the wafer blade into one of these chambers and then extract it from that chamber. Some other combination of motor rotation can be used to extend or retract the wafer blade as the robot is being rotated about axis x.

To keep wafer blade 86 directed radially away from the rotation axes x, an interlocking mechanism is used between the pivots or cams 85,89 to assure an equal and opposite angular rotation of each pivot. The interlocking mechanism may take on many designs, including intermeshed gears or straps pulled around the pivots in a figure 8 pattern or the equivalent. One preferred interlocking mechanism is a pair of intermeshed gears 92 and 93 formed on the pivots 85 and 89. These gears are loosely meshed to minimize particulate generation by these gears. To eliminate play between these two gears because of this loose mesh, a weak spring 94 may be extended between a point 95 on one gear to a point 96 on the other gear such that the spring tension lightly rotates these two gears in opposite directions until light contact between these gears is produced.

Figure 3:
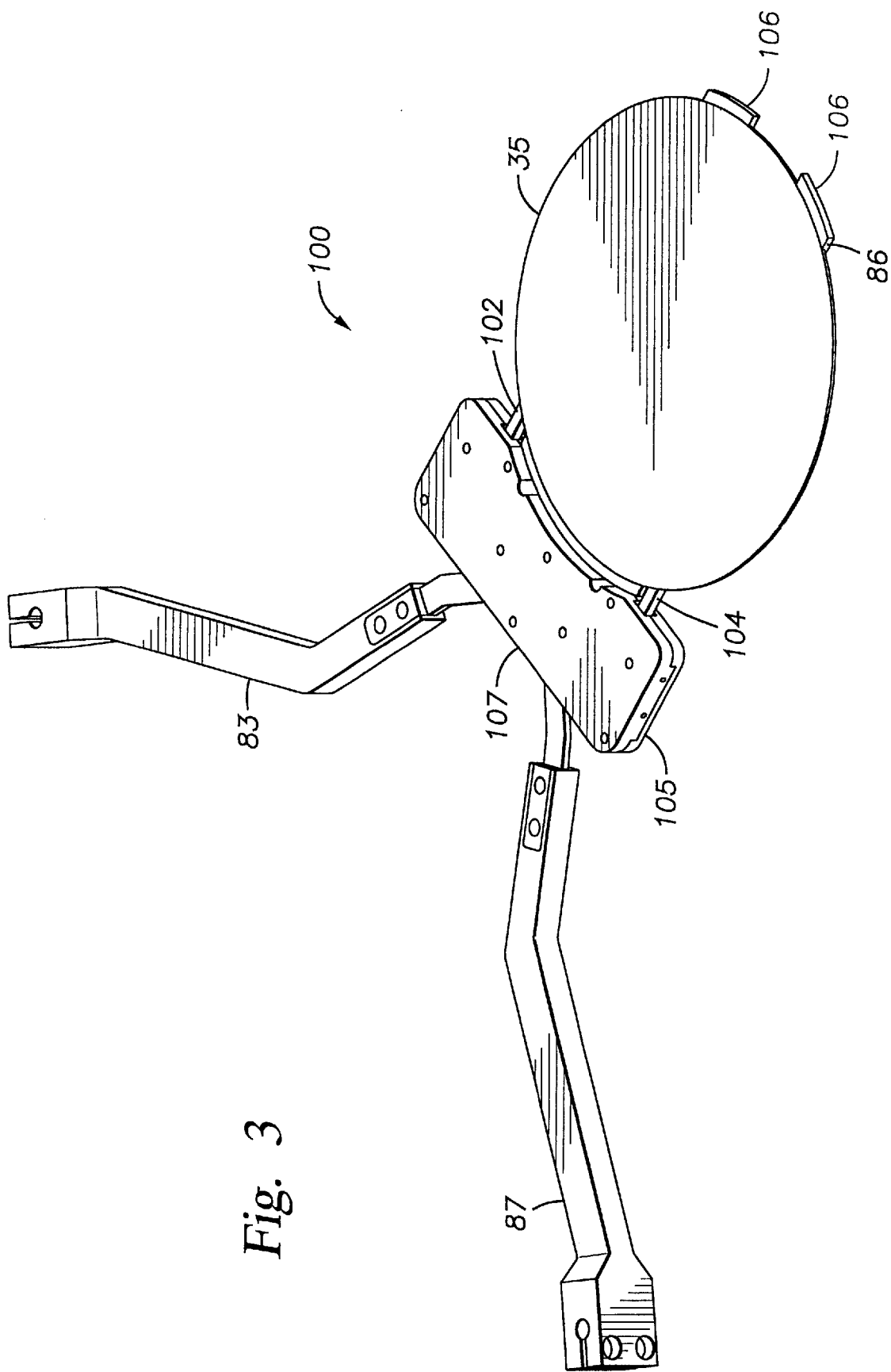
FIG. 3 is a perspective view of the wrist assembly of the present invention shown clamping a wafer on the blade.

Now referring to FIG. 3, a perspective view of the wrist assembly 100 of the present invention is shown clamping a wafer 35 on the blade 86. Clamp fingers 102,104 are shown extended from the housing defined by the top cover plate 107 and bottom cover plate 105 of wrist 100 to engage the perimeter of the wafer 35. The wafer 35 is held securely between the fingers 102,104 and the blade bridge 106 under forces applied by a pair of springs 110,112 (see FIG. 4).

Figure 4:
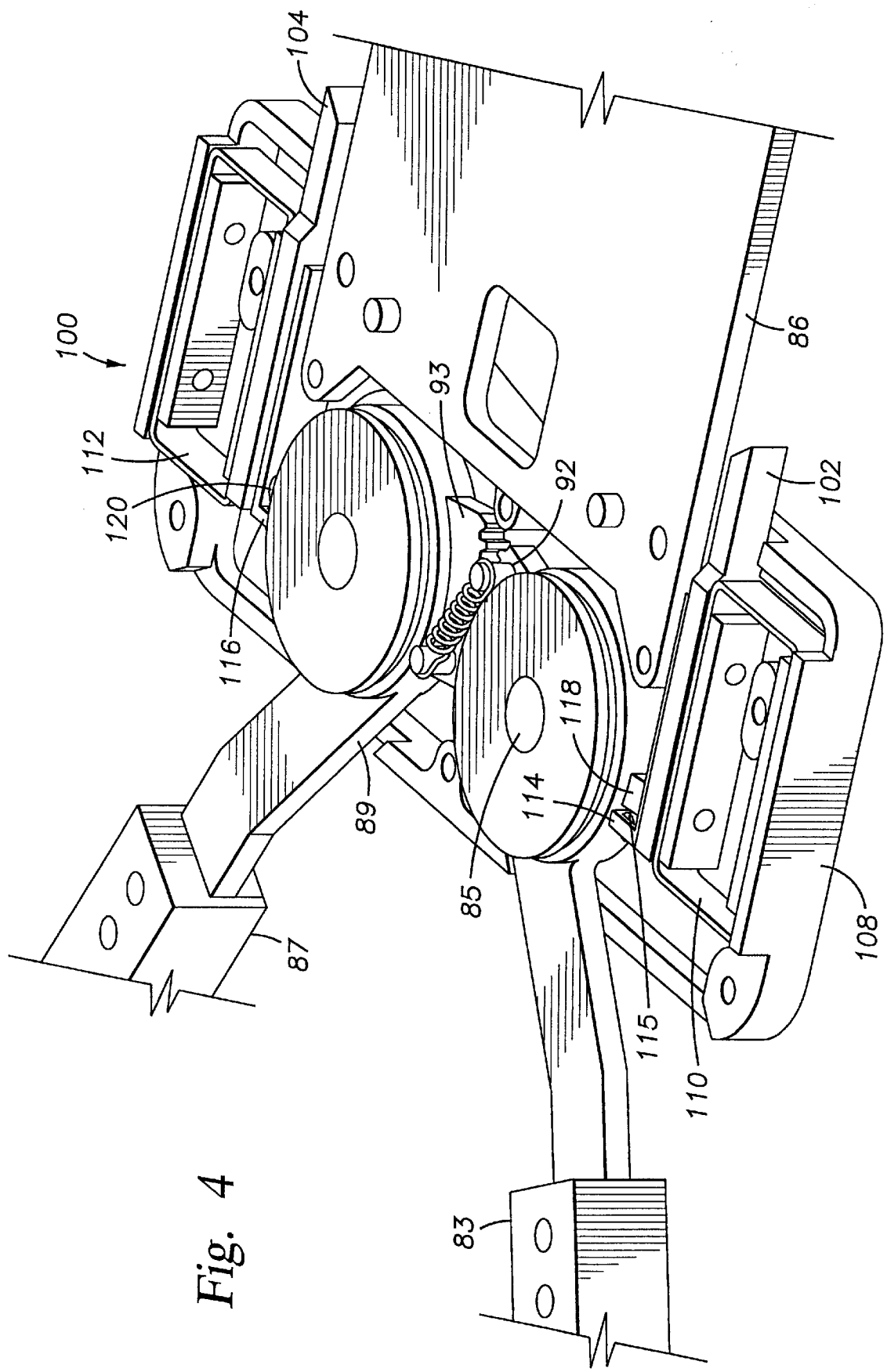
FIG. 4 is a bottom perspective view of the wrist assembly with the bottom cover plate removed.

Now referring to FIG. 4, a bottom perspective view of the wrist assembly 100 is shown with the bottom cover plate removed. In addition to the standard wrist components of FIGS. 1 and 2, the wrist 100 includes two clamp fingers 102,104 extending beyond the top cover plate 108. The fingers 102,104 are coupled to springs 110,112, illustrated here as parallelogram springs, to bias the fingers outward to a position engaging the wafer edge. Lip members 114,116 are adjustably coupled to the side of the fingers 102,104 adjacent the pivots 85,89, respectively. It is preferred that the lip members each have a roller 115,117 facing the cog to prevent friction between the cog and lip that could generate particles.

The pivots 85,89 are equipped with cogs 118,120 fixably attached to pivots 85,89, respectively, so that the cogs move with rotation of the struts 83,87. During extension of the robot 14, the struts 83,87 come closer together. A corresponding rotation is imparted on the pivots 85,89 and cogs 118,120. At some point as the robot extends, the rotation of the cogs 118,120 is sufficient to engage the lips 114,116 and retract the clamp fingers 102,104 away from the wafer 35.

The exact point at which the cog engages the lip and begins to release the wafer is adjusted by positioning and securing the lips 114,116 at a point along the length of the finger 102,104. This adjustment can be made so that the wafer is released at any desired degree of radial extension. For example, the lip may be adjusted according to the following steps. First, the fastener used to couple the lip to the clamp finger is loosened. Second, a wafer is positioned on the robot blade with one edge against the retaining bridge 106 (See FIG. 3), such that the clamp finger engages the opposite edge of the wafer and clamps the wafer. Third, the blade is extended to the radial distance at which it is desired for the wafer to be released. The lip is then pushed up against the cog and securely fastened to the clamp finger.

With the clamp wrist so adjusted, the clamp finger is normally in the clamped position so that only radial extension of the blade beyond this point will cause the wafer to be released. The biasing member is preferably a parallelogram spring, but may also be any type of spring, elastic member, pneumatic device, electromagnetic device or the like. To facilitate and anchor the biasing member, a base plate is pivotally coupled to the cams and provides a stable working surface. The base plate may be given any convenient shape, but will preferably be no larger than necessary to accommodate the biasing member.

Figure 5:
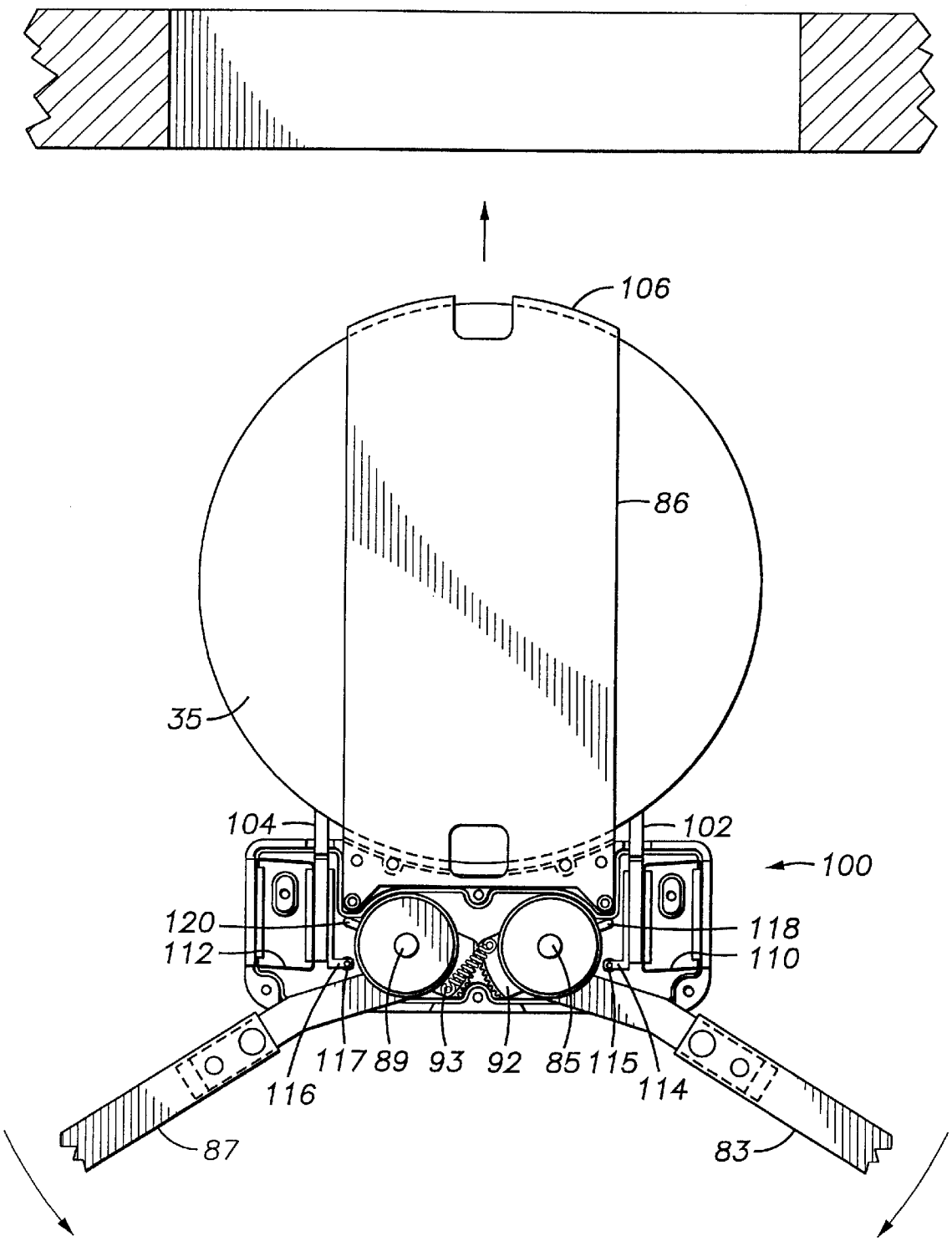
FIGS. 5–7 are bottom views of the wrist assembly with the bottom cover plate removed showing how the clamp mechanism releases the wafer near full extension.
Figure 6:
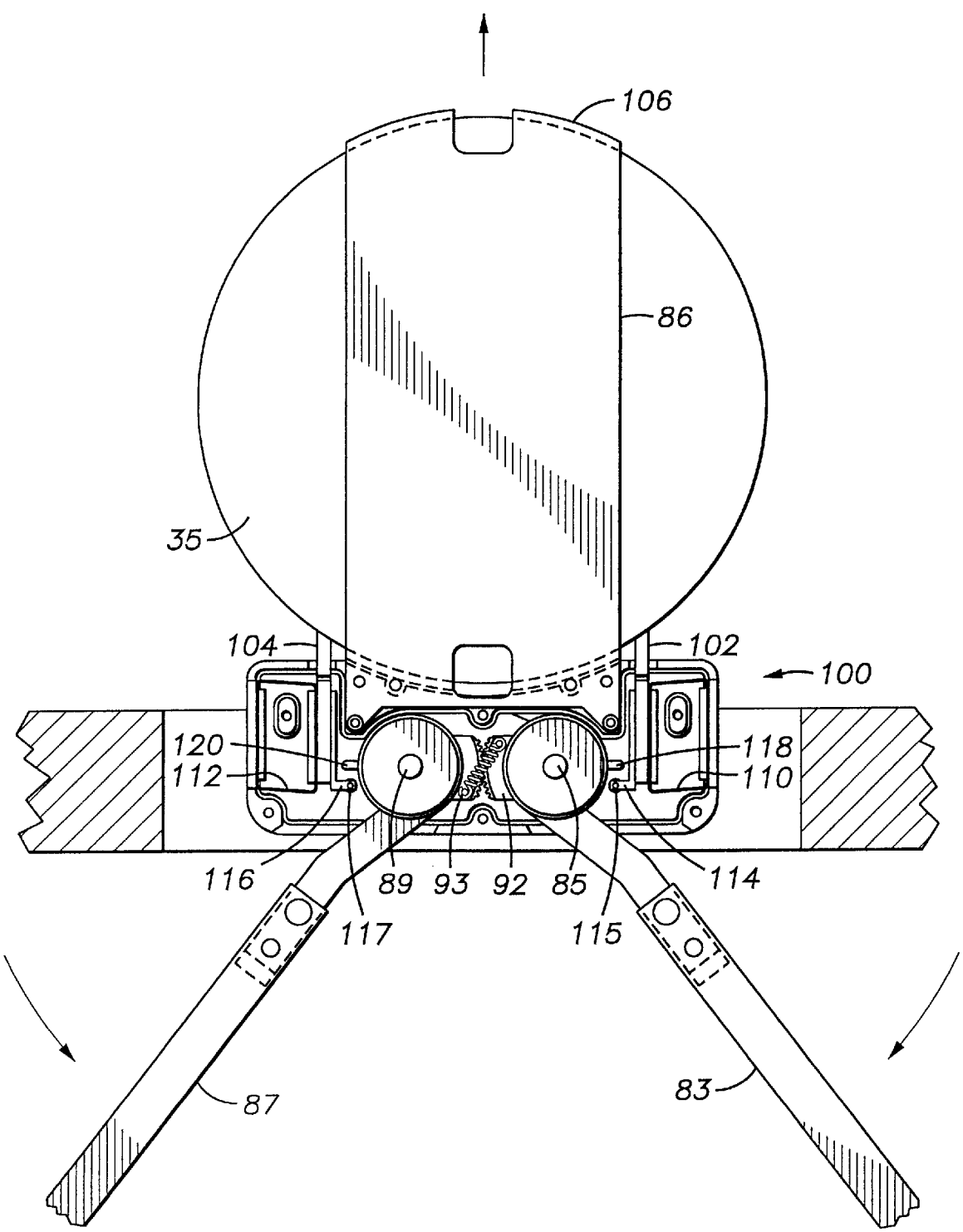
Figure 7:
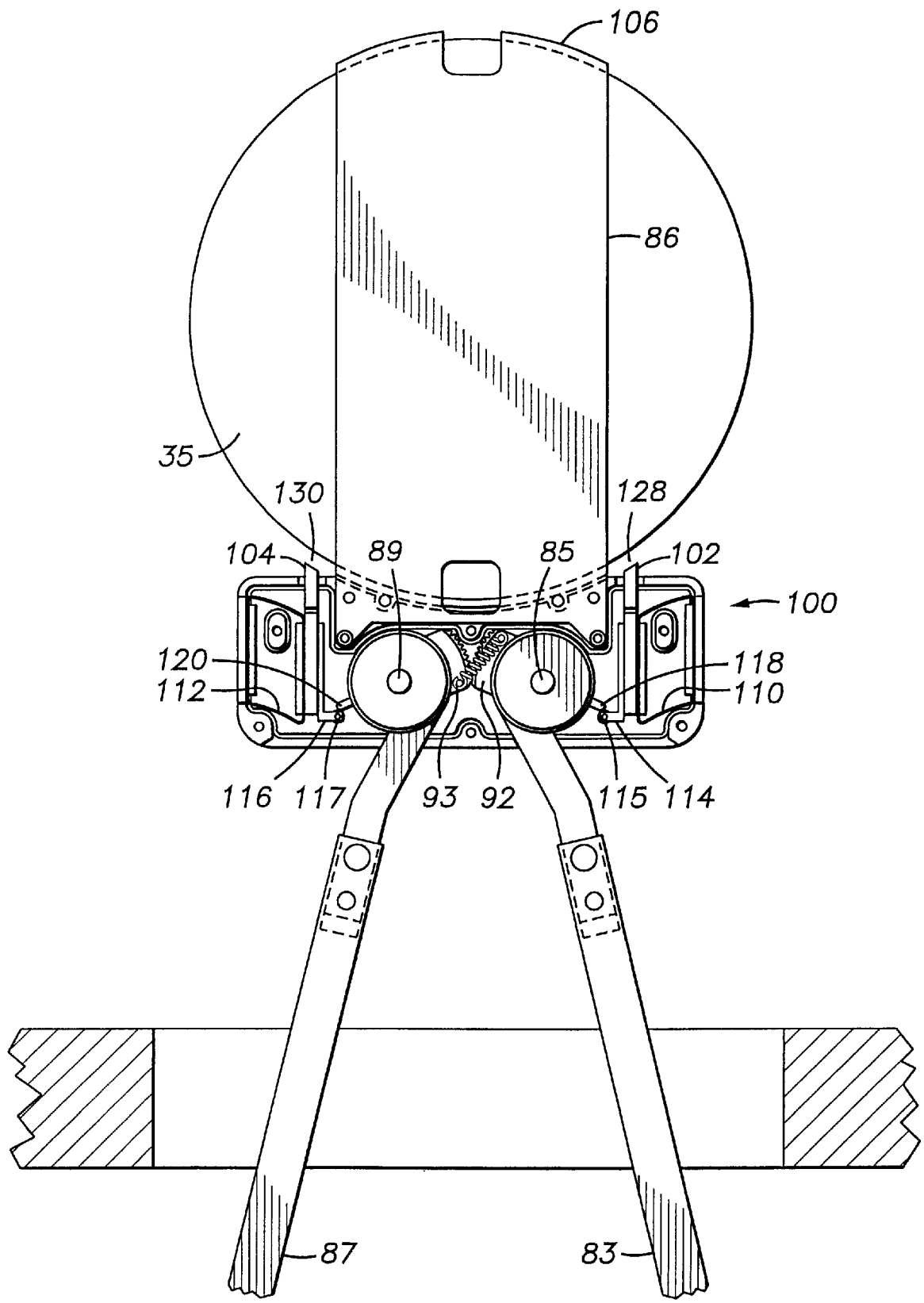

Now referring to FIGS. 5–7, bottom views of the blade 86 and wrist assembly with the bottom cover plate 105 (see FIG. 3) removed are shown at increasing radially extended positions. The sequence of FIGS. 5–7 are useful to illustrate how the clamp mechanism releases the wafer near full extension. FIG. 5 shows the wrist 100 of FIG. 4 in a fully retracted position as when the assembly is rotated. Note that the clamp fingers 102,104 are engaged against the perimeter of wafer 35 and that the springs 110,112 are slightly flexed to apply a predetermined force to the fingers in the direction of the wafer. The engagement of the two clamp fingers 102,104 not only clamps the wafer, but centers the wafer on the blade 86. Because the wafer will always be centered, there are fewer handling errors and there is no need to used sophisticated center finding equipment, although it could still be used. Also note that when the wrist 100 is fully retracted, the proximal distance between the cogs 118,120 and the lips 114,116 is at a maximum.

FIG. 6 shows the blade 86 and wrist assembly 100 halfway between the fully retracted and fully extended position. Consequently, the pivots 85,89 have been rotated so that cogs 118,120 are approaching the lips 114,116. However, the clamp fingers 102,104 have not yet been retracted and continue to engage and secure the wafer 35.

FIG. 7 then shows the blade 86 and wrist assembly 100 extended to a point where the clamp will be released, just short of the fully extended position. The wafer is released on continued rotation of the pivots 85,89 as the cogs 118,120 engage the lips 114,116 and pull the clamp fingers 102,104 away from the wafer edge. Note the gaps 128,130 between the clamp fingers and the wafer edge that allow the wafer to be lifted from the blade by another apparatus, such as the lift pins of a processing chamber (not shown). It is also instructive to note that the springs 110,112 are now further displaced than in either FIGS. 5 or 6.

Figure 8:
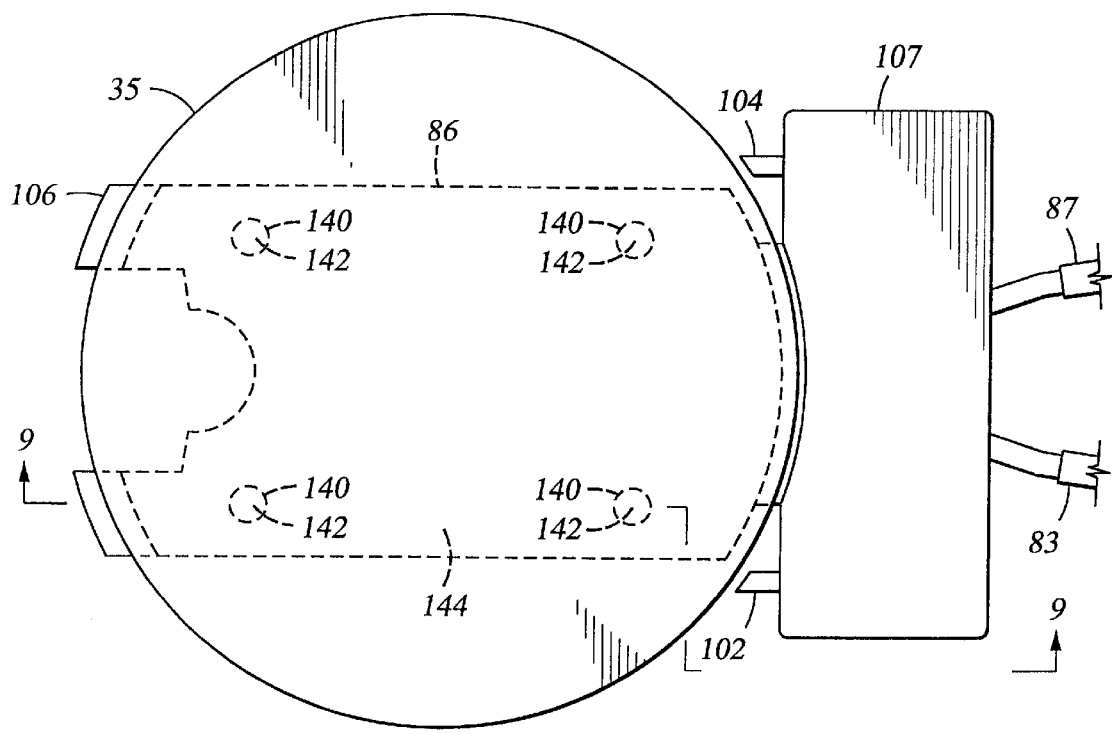
FIGS. 8 and 9 are top and cross-sectional views of a wafer blade having a plurality of wafer support members.
Figure 9:
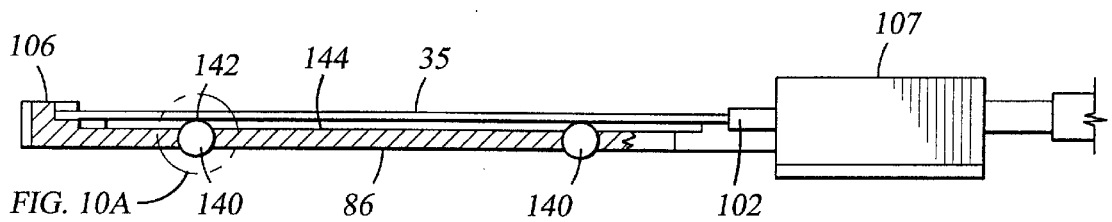

FIGS. 8 and 9 are top and cross-sectional views of a wafer blade 86 having a plurality of wafer support members 140. The wafer support members 140 are coupled to, or integrally formed in, the wafer blade 86 and have a wafer contacting surface 142 that extends upward a sufficient distance above the top surface 142 of the wafer blade 86 to prevent the bottom surface of the wafer 35 from making contact with the top surface 144 of the wafer blade 86. In this manner, the wafer support members 140 reduce the degree to which the bottom surface of the wafer 35 is contacted and rubbed, thereby reducing the likelihood or degree of particle generation or wafer damage. While it is generally preferred to minimize particle generation or wafer damage, the importance of this objective may be heightened in applications where the bottom surface of the wafer is coated, such as with gold.

Although a wafer could be supported on as few as three wafer support members 140, it is preffered that the wafer blade 86 include at least four wafer support members 140. It is also generally preferred that the wafer support members 140 be spread out as great a distance as is practical in order to provide stability to the wafer 35 received thereon, even though additional stability will be provided when the wafer is clamped. When the clamp fingers 102, 104 engage the wafer, the wafer is secured between the fingers and the blade bridge 106. If the wafer was originally positioned on the robot blade 86 with a small gap between the wafer edge and the blade bridge 106, then the engagement of the clamp fingers 102, 104 will push the wafer until it moves against the blade bridge 106. It is during this movement of the wafer relative to the robot blade 86 that the bottom surface of the wafer encounters frictional forces with the top surface 142 of the support members 140. However, unlike the support members of conventional blades which contact the wafer over a large surface area, the support members of the present invention reduce or minimize the degree of contact and friction therebetween and, thereby, reduces or eliminates wafer damage or particle generation. Consequently, the support members of the present invention would not have been useful with conventional, non-clamping robot blades which rely on friction to keep the wafer on the blade during movement of the blade. The support members 140 of the present invention are not relied upon to provide friction, but rather to reduce friction and damage to the bottom of the wafer. It is the clamping action of the present invention that holds the wafer in place on the blade during movement of the blade.

While the support members 140 may be made from any material, it is generally desirable to select a material that does not corrode in the process environment, erode or generate particles from contact with the wafer, and does not damage the wafer surface. Materials preferred for use as support members include alumina, blue saphire, zirconia, silicon nitride and silicon carbide. The support member may also be made from a machined metal component having a ceramic coating thereon.

Figure 10A:
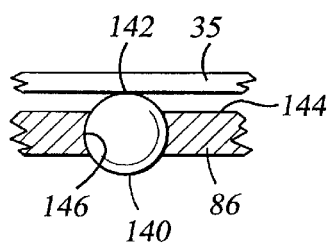
FIGS. 10A is a magnified partial cross-sectional view of the wafer blade and a wafer support member as indicated in FIG. 9.

FIGS. 10A is a magnified partial cross-sectional view of the wafer blade 86 and a wafer support member 140 as indicated in FIG. 9. The support member in FIG. 10A is shown as a ball bearing than can rotate within bearing surfaces 146. Because the bearings are free to rotate or roll, the degree of friction between the member 140 and the wafer 35 may be further reduced or eliminated.

Figure 10B:
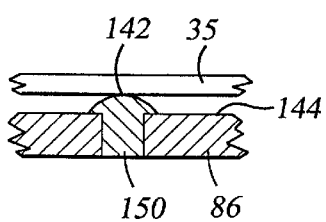
FIGS. 10B and 10C are partial cross-sectional views of alternative wafer support members that may be used instead of, or in combination with, the wafer support member of FIG. 10A.
Figure 10C:
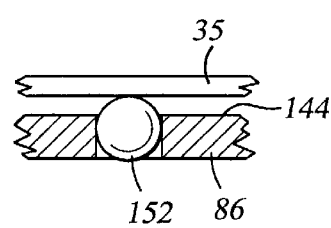

FIGS. 10B and 10C are partial cross-sectional views of alternative wafer support members 150, 152 that may be used instead of, or in combination with, the wafer support member 140 of FIG. 10A. The support member 150 of FIG. 10B comprises a post that is rigidly received within a hole in the blade 86 and a semi-spherical button 154 which forms the top surface 142 that contacts the wafer 35. The support member 152 of FIG. 10C is a ball or sphere that is rigidly secured with a hole in the blade 86 so that the top surface 142 extends slightly above the top surface 144 of the blade 86. Each of the designs in FIGS. 10A, 10B, and 10C, and their equivalents, may be used alone or in combination to provide support for the wafer 35.

FIGS. 11 and 12 are top and cross-sectional views of a wafer blade having a sloped pocket that supports the wafer. The sloped pocket comprises a pair of opposing, inwardly slanting surfaces 160, 162 that support the wafer 35 along the bottom perimeter edge of the wafer.

FIGS. 13 and 14 are partial cross-sectional views of the distal end and proximate ends of a wafer blade and sloped pocket as indicated in FIG. 12. While the slanting surfaces 160, 162 may be slanted or sloped at various angles, it is preferred that the surfaces 160, 162 form an angle $\alpha$ that is between about 5 and about 30 degrees with the horizontal plane of the blade 86. The most preferred angle $\alpha$ is substantial equal to the beveled angle forming a surface 166 along the lower edge of the wafer 35. The exact angle of the surface 166, typically specified to be between about 7 and about 10 degrees, is effected by the size of the exclustion zone, which typically is between about 3 and about 6 millimeters. By providing such preferred angles, the degree of friction between the wafer edge and the surfaces 160, 162 is low and the horizontal force applied to the wafer 35 by the clamp finger 104 can easily push the wafer edges in the direction of arrows 164 until the wafer rests against the blade bridge 106. It should also be recognized the the slanted surfaces 160 and/or 162 may be used in combination with the other types of support members disclosed herein. For example it is possible to combine the slanted surface 160 near the blade bridge 106 with a pair of buttons 150 near the clamp fingers 102, 104.

While the foregoing is directed to the preferred embodiment of the present invention, other and further embodiments of the invention may be devised without departing from the basic scope thereof. The scope of the invention is determined by the claims which follow.

What is claimed is:

1. A wafer blade, comprising:
   a) a body having an upper and lower surface; and
   b) a plurality of ceramic wafer support members disposed at least partially above the upper surface of the body, the wafer support members being at least partially spherically shaped.

2. The wafer blade of claim 1, wherein the wafer support members are disposed inwardly from the edges of the blade surface.

3. The wafer blade of claim 1, wherein the blade comprises a non-conductive ceramic material.

4. The wafer blade of claim 1, wherein the wafer support member comprises a material selected from a group consisting of alumina, sapphire, zirconia, silicon nitride, and silicon carbide and combinations and alloys thereof.

5. The wafer blade of claim 1, wherein the wafer support members are comprised of a metal with a ceramic coating formed thereon.

6. The wafer blade of claim 1, wherein at least one of the wafer support members comprise a ball-bearing.

7. The wafer blade of claim 1, wherein the wafer support members are disposed at least partially through the blade.

8. A substrate processing system, comprising:
   a) a chamber;
   b) a robot disposed in the chamber; and
   c) a blade connected to the robot, the blade comprising:
      i) a body having an upper and lower surface; and
      ii) a plurality of ceramic wafer support members disposed at least partially above the upper surface of the body, the wafer support members being at least partially spherically shaped.

9. The system of claim 8, wherein the wafer support members are disposed inwardly from the edges of the blade.

10. The system of claim 8, wherein the wafer support members comprise a non-conductive material.

11. The system of claim 8, wherein the wafer support members comprise a metal having a ceramic coating.

12. The system of claim 8, wherein the wafer support member comprises a material selected from a group consisting of alumina, sapphire, zirconia, silicon nitride, and silicon carbide and combinations and alloys thereof.

13. The system of claim 8, wherein at least one of the wafer support members comprise a ball-bearing.

* * * * *

UNITED STATES PATENT AND TRADEMARK OFFICE
CERTIFICATE OF CORRECTION

PATENT NO. : 6,222,337 B1　　　　　　　　　　　　　　　　　　　　　Page 1 of 1
DATED : April 24, 2001
INVENTOR(S) : Kroeker et al.

It is certified that error appears in the above-identified patent and that said Letters Patent is hereby corrected as shown below:

Column 7,
Line 50, please replace "preffered" with -- preferred --.

Column 8,
Line 65, please replace "the the" with -- that the --.

Signed and Sealed this

Fifth Day of March, 2002

Attest:

JAMES E. ROGAN
*Attesting Officer*　　　*Director of the United States Patent and Trademark Office*